US006175611B1

(12) United States Patent
Melen et al.

(10) Patent No.: US 6,175,611 B1
(45) Date of Patent: Jan. 16, 2001

(54) TIERED DETECTOR ASSEMBLY

(75) Inventors: Robert E. Melen, Saratoga; David A. Pearson, Sunnyvale; Joseph A. Heanue, Half Moon Bay; Stephen L. Shapiro, Los Altos Hills; Eugene L. Atlas, Carlsbad, all of CA (US)

(73) Assignee: Cardiac Mariners, Inc., Los Gatos, CA (US)

(*) Notice: Under 35 U.S.C. 154(b), the term of this patent shall be extended for 0 days.

(21) Appl. No.: 09/167,318

(22) Filed: Oct. 6, 1998

(51) Int. Cl.$^7$ ............................................. A61B 6/03
(52) U.S. Cl. .......................... 378/19; 378/98.2; 250/332; 250/370.09
(58) Field of Search ................. 378/98.2, 4, 19; 250/370.09, 370.08, 332, 366

(56) References Cited

U.S. PATENT DOCUMENTS

| | | | |
|---|---|---|---|
| 3,499,146 | 3/1970 | Richards | 250/61.5 |
| 3,778,614 | 12/1973 | Hounsfield | 250/362 |
| 3,919,556 | 11/1975 | Berninger | 250/366 |
| 3,936,639 | 2/1976 | Barrett | 250/369 |
| 3,944,833 | 3/1976 | Hounsfield | 250/367 |
| 3,949,229 | 4/1976 | Albert | 250/401 |
| 3,973,128 | 8/1976 | LeMay | 250/445 |
| 4,010,370 | 3/1977 | LeMay | 250/366 |
| 4,031,395 | 6/1977 | LeMay | 250/360 |
| 4,057,745 | 11/1977 | Albert | 313/55 |
| 4,059,766 | 11/1977 | Rougeot | 250/370 |
| 4,066,902 | 1/1978 | LeMay | 250/363 |
| 4,383,327 | 5/1983 | Kruger | 378/19 |
| 4,464,776 | 8/1984 | Erker | 378/10 |

(List continued on next page.)

FOREIGN PATENT DOCUMENTS

| | | | |
|---|---|---|---|
| 0138647 A2 | 4/1985 | (EP) | H01L/25/04 |
| WO 94/23458 | 10/1994 | (WO) | H01L/31/115 |
| WO 96/25024 | 8/1996 | (WO) | H05J/35/00 |

OTHER PUBLICATIONS

Chen, William S., Focal Plane Architecture: an Overview, Advances in Focal Plane Technology, SPIE vol. 217, pp. 2–7, 1980.*

Moon, "Amplifying and Intensifying the Fluroscopic Image by Means of a Scanning X–ray Tube", Oct. 6, 1950, *Science*, vol. 112, pp. 389–395.

Philips Photonics, "xP1700 Multichannel Photomultipliers", *Xp1700 Family of Multi–channel Photomultipliers–Philips Photonic Handbook*, at least by Dec. 1993, pp. 3–15.

Pond, "Application of Optical Instrumentation in Medicine VIII", Proceedings of the Society of Photo–Optical Instrumentation Engineers, Apr. 20–22, 1890, Vol. 233, pp. 75–82.

Parker, "A Proposed VLSI Pixel Device for Particle Detection", *Nuclear Instruments and Methods in Physics Research*, 1989, pp. 494–516.

Primary Examiner—David P. Porta
Assistant Examiner—Drew A. Dunn
(74) Attorney, Agent, or Firm—Lyon & Lyon LLP

(57) ABSTRACT

An x-ray detector, useful in x-ray imaging systems constructed from a single piece of silicon and a photon sensing crystal, and comprises a plurality of detector elements, each of the plurality of detector elements comprising a plurality of detector sub-elements. A plurality of x-ray detectors are arranged in a multi-dimensional array, each array of detectors tiered with respect to the next array of detectors. A compact electronics circuitry is also provided. The compact electronics circuitry is contained in each of the plurality of detector sub-elements. The compact electronics circuitry comprises a photon sensor, an amplifier, a discriminator and a digital-to-analog converter. Finally, a method for generating x-ray transmissiveness information is also provided.

9 Claims, 12 Drawing Sheets

U.S. PATENT DOCUMENTS

| | | | |
|---|---|---|---|
| 4,527,183 | 7/1985 | Anthony et al. | 357/30 |
| 4,593,381 | 6/1986 | Shapiro et al. | 365/45 |
| 4,684,812 | 8/1987 | Tew et al. | 250/578 |
| 5,132,539 | 7/1992 | Kwasnick et al. | 250/361 |
| 5,153,438 | 10/1992 | Kingsley et al. | 250/370.09 |
| 5,187,369 | 2/1993 | Kingsley et al. | 250/370.11 |
| 5,241,576 * | 8/1993 | Lonn | 378/19 |
| 5,355,013 | 10/1994 | Parker | 257/458 |
| 5,379,336 | 1/1995 | Kramer et al. | 378/98.8 |
| 5,430,784 * | 7/1995 | Ribner et al. | 378/19 |
| 5,550,378 | 8/1996 | Skillicorn et al. | 250/367 |
| 5,664,612 | 9/1997 | Moorman et al. | 378/98.2 |
| 5,737,382 * | 4/1998 | Stierstorfer | 378/19 |
| 5,802,138 * | 9/1998 | Glasser et al. | 378/19 |
| 5,867,554 * | 2/1999 | Hupke | 378/19 |
| 6,005,908 * | 12/1999 | Oppelt et al. | 378/19 |

\* cited by examiner

TIERED DETECTOR ASSEMBLY

BACKGROUND OF THE INVENTION

1. Field of the Invention

The present invention pertains to the field of detectors including, more specifically, to detectors capable of use in imaging systems.

2. Background

In a typical known embodiment of a reverse-geometry x-ray imaging system, an output signal from a detector is applied to the z-axis (luminance) input of a video monitor. This signal modulates the brightness of the viewing screen. The x and y inputs to the video monitor are typically derived from the signal that effects deflection of the electron beam of an x-ray tube. Therefore, the luminance of a point on the viewing screen is inversely proportional to the absorption of x-rays passing from the source, through the object, to the detector.

Time and area distributions of x-ray flux follow a Poisson distribution and have an associated randomness that is unavoidable. The randomness is typically expressed as the standard deviation of the mean flux, and equals its square root. The signal-to-noise ratio of a x-ray image under these conditions is equal to the mean flux divided by the square root of the mean flux. i.e., for a mean flux of 100 photons, the noise is +/–10 photons, and the signal-to-noise ratio is 10.

In many reverse-geometry scanning beam x-ray systems, the spatial resolution of the resulting image is in large part determined by the capture area of one of the detector elements. Generally speaking, a non-segmented detector with a small capture area can provide high spatial resolution and poor collection efficiency (i.e., the ratio of the meaningful photons passing through the object to the total number of photons passing through the object), while a non-segmented detector with a large capture area provides high collection efficiency and poor spatial resolution.

A medical imaging system should provide low patient dosage, high spatial resolution and a refresh rate of up to about 30 times per second which is the refresh rate of a standard video display—all at the same time. The spatial resolution and the signal-to-noise ratio of x-ray images formed by known reverse-geometry x-ray imaging systems are dependent, to a large extent, upon the size of the sensitive area of the detector element. If the sensitive area of the detector element in these systems is increased, more of the diverging rays are detected, effectively increasing sensitivity and improving the signal-to-noise ratio. At the same time, however, in some medical applications, larger detector areas tend to reduce the attainable spatial resolution as the "pixel" size (measured at the plane of the object to be imaged) becomes larger. This is so because of the distance typical objects to be imaged in some medical applications (e.g., structures internal to the human body) are from the x-ray source. These issues may be addressed to a certain extent by increasing the x-ray photon flux.

In the medical field, several conflicting factors, among them patient dosage, frame rate (the number of times per second that the image refreshed), and resolution of the image of the object, often add additional constraints. For example, a high x-ray flux may provide high resolution and a high frame rate, yet result in an unacceptably high x-ray dosage to the patient and attending staff.

While on the other hand, lower dosages may be achieved from known systems at the cost of a resolution image or a lower refresh rate. In known medical x-ray imaging systems, therefore, the detector element area typically selected to effect a compromise between resolution and sensitivity given the other constraints.

Solid state x-ray detectors for x-ray imaging systems are known. An example of a solid state x-ray detector is disclosed in U.S. Pat. 5,379,336 to Kramer et al. Kramer et al. discloses a hybrid detector array with many thousands of individual detector pixels on a single semiconductor substrate interconnected to a corresponding readout with individual amplifiers and signal condition circuits for each pixel and multiplexor output. The detector pixels of the type disclosed in Kramer et al. generate electrical signals in response to x-ray photons. The detector pixels disclosed in Kramer et al. are 30 $\mu$m by 30 $\mu$m. These detector pixels are therefore of a small size to increase spatial resolution. One problem associated with having detector pixels of a small size is that more than one detector pixel in a given area may be effected by a single x-ray photon. This situation can affect the accuracy of an image of an object under investigation.

There is a need for a x-ray detector that has high resolution and collection efficiency and that provides information in a way that is easy to process in an efficient manner. There is additionally a need for a x-ray detector that minimizes the possibility of signals indicating the false or phantom detection of x-ray radiation while minimizing the x-ray dosage to the object under investigation.

SUMMARY OF THE INVENTIONS

The present invention comprises a detector array useful in medical x-ray imaging systems comprising a plurality of detector elements comprising a plurality of detector sub-elements. The outputs of the detector sub-elements are connected to summing circuitry which outputs a signal indicative of the number of photons striking the detector element. Preferably the plurality of detector elements, sub-elements and summing circuitry are mounted on a single substrate.

In one aspect of the inventions, the plurality of x-ray detector sub-elements each comprise a sensor and their associated sub-element electronics.

In another aspect of the inventions the detector assembly comprises tiered detector arrays wherein each tier comprises a plurality of detectors. Preferably the detectors comprise detector elements which in turn comprise detector sub-elements. The detector sub-elements are associated with sub-element electronics preferably comprising veto circuitry. The sub-element electronics preferably provide an output to summing circuitry. The summing circuitry preferably provides a detector element output which is used in generating an image of an object under investigation.

In another embodiment, a method for generating x-ray transmissiveness information is provided. In one aspect of the inventive method, the method of detecting an x-ray photon comprises directing an x-ray beam from an x-ray source to a detector assembly; generating an electrical signal indicative of the energy level of a photon energizing a detector sensor; determining whether the electrical signal is a valid detection; comparing the valid detection with at least one other detector and precluding erroneous detections.

According to one aspect of the inventions, the detector array is formed by combining a plurality of detectors into an array of detectors. The detector array has a multi-tiered structure, each tier having at least one detector, and each tier in a different plane than any other tier.

BRIEF DESCRIPTION OF THE DRAWINGS

Preferred embodiments of the present invention are illustrate by way example, and not by way limitation, in the figures of the accompanying drawings and in which like reference numerals refer to similar elements and in which.

DETAILED DESCRIPTION OF THE PREFERRED EMBODIMENTS

Figure 1:
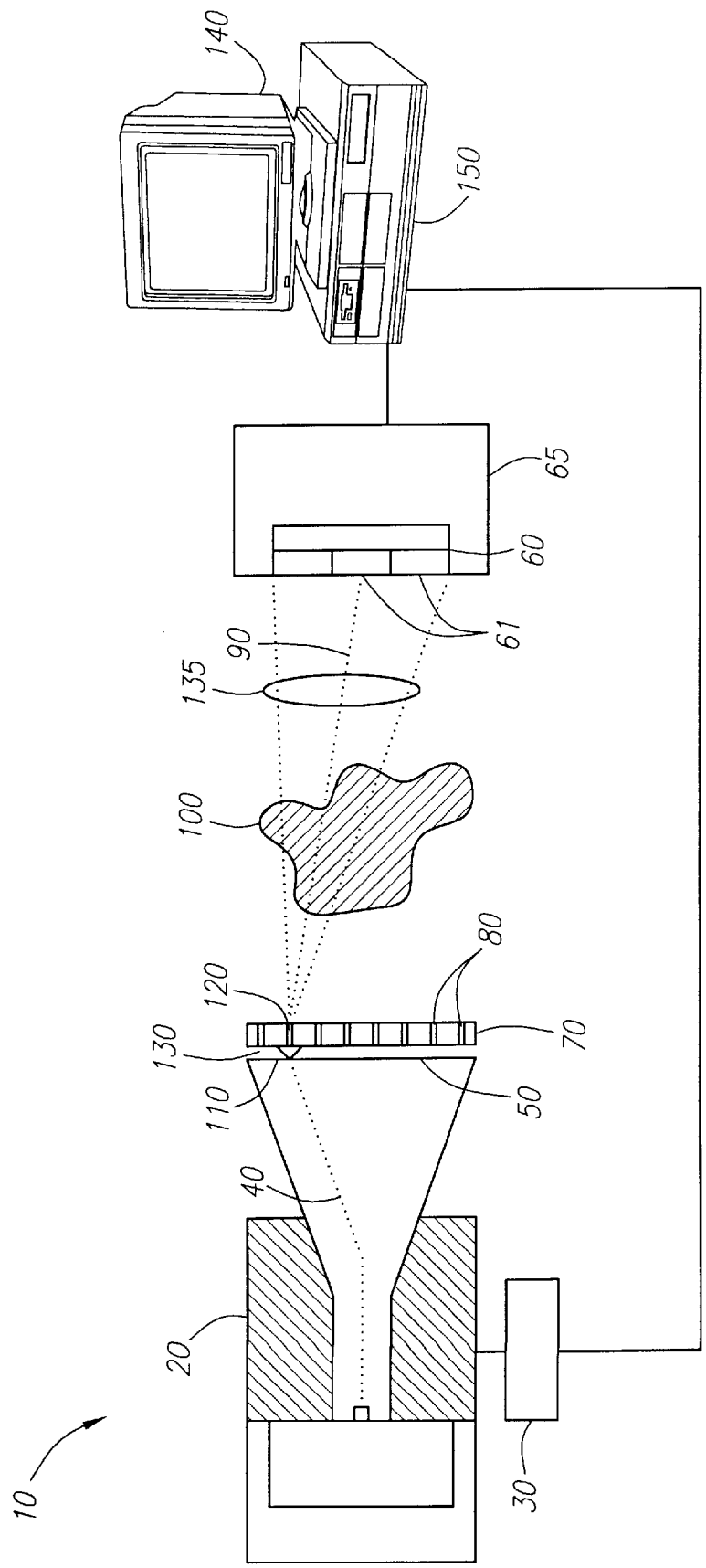
FIG. 1 is a diagrammatic representation of a scanning beam x-ray imaging system.

FIG. 1 is a diagram showing components of a x-ray imaging system embodying aspects of the invention. X-ray source 10 preferably includes an electron beam source comprising a power supply which can operate x-ray source 10 at about −70 kV to −120 kV. In the present embodiment, this voltage level preferably produces a spectrum of x-rays ranging to 120 keV. Electron beam 40, which is generated within x-ray source 10 by a charged particle gun, is deflected over the surface of a target assembly 50 in a predetermined pattern, e.g., a scanning or stepping pattern. X-ray source 10 also preferably includes a mechanism to control the movement of electron beam 40 across target assembly 50, such as a deflection yoke 20 under the control of an electron beam pattern generator 30. One advantage provided by the geometry of x-ray source 10 is that it allows x-rays to be projected at an object 100 from multiple angles without requiring physical relocation of the x-ray source 10.

A presently preferred x-ray source 10 is disclosed in copending U.S. patent application Ser. Nos. 09/167,399 and 09/167,524 and a presently preferred target assembly 50 is disclosed in copending U.S. patent application Ser. No. 09/167,523, all filed concurrently with the present application, all of which are incorporated herein by reference in their entirety. A presently preferred method and apparatus for generating and moving electron beam 40 across target assembly 50 is disclosed in commonly owned U.S. Pat. No. 5,644,612 which is incorporated herein by reference in its entirety.

In FIG. 1, a collimating assembly is located between x-ray source 10 and a tiered detector assembly 60. In the preferred embodiment, the collimating assembly is located between x-ray source 10 and the object 100 to be imaged. In one embodiment, the number of apertures 80 in collimator grid 70 corresponds to the number of image pixels that are to be displayed on monitor 140 or other visual display devices that can be connected to the video output of the x-ray imaging system. Alternatively, the image pixel to aperture ratio is increased, so that the number of apertures are less than the number of image pixels that are displayed on a display device. An "object pixel," for purposes of this discussion, is an area in a plane of the object about which information is being collected. An image pixel is a picture element that is an image representation of one or more object pixels. The presently preferred number of apertures is 10,000 arranged in a 100 by 100 grid. The number of apertures suggested above is for illustrative purpose only and depends on the particular application to which the invention is directed. Examples of preferred collimator grids and beam hardening filters that can be utilized in the invention include these depicted and disclosed in copending U.S. Pat. No. 5,610, 967, and U.S. patent application Ser. No. 09/167,639, filed concurrently with the present application, both of which are incorporated herein by reference in their entirety.

In operation, electron beam 40 preferably dwells at a location 110 on target assembly 50 which is located substantially at a position where the axis 90 for a particular aperture 120 of collimator grid 70 intersects the target assembly 50. As the electron beam 40 strikes target assembly 50 at location 110, a cascade of x-rays 130 is emitted. Only the portion of the cascade of x-rays 130 whose path lies substantially along axis 90 pass through aperture 120 and form a diverging x-ray beam 135. The shape of x-ray beam 135 is influenced by the shape of aperture 120. For instance, if the aperture is square, the x-ray beam 135 takes on a generally truncated pyramidal shape. If the aperture is circular, x-ray beam 135 takes on a generally conical shape. In a preferred embodiment, the shape and area of the aperture is such that the area of maximum divergence of the x-ray beam 135 is substantially the same as the dimensions of the x-ray capture surface for multi-detector array 60 and the axis 90 passes through the geometric center of the tiered detector assembly 60.

Tiered detector assembly 60 preferably comprises a plurality of tiers of detector arrays. Each tier preferably comprises detector elements 61 arranged in an array. Each detector element 61 preferably provides discrete information indicative of the number of x-ray photons that energize the x-ray sensing surface. When an object 100 is interposed between the x-ray source 10 and the tiered detector assembly 60, some of the x-rays in x-ray beam 135 will pass through a portion of object 100, and if not scattered or absorbed, will energize the x-ray sensing surface of the detector elements. The x-rays that strike the x-ray sensing surface of any individual detector element comprise a portion of x-ray beam 135 that is referred to herein as an x-ray beam subpath.

In a preferred embodiment, each detector element comprises components for determining the quantity of x-ray photons that strike x-ray sensing surface of the detector element and outputting a signal indicative of that determination. Alternatively, each detector element includes components for determining the energy of the x-rays that strike x-ray sensing surface of the detector element. The tiered detector assembly 60 outputs transmissiveness information that is proportional to the x-ray transmission of the object 100 along particular x-ray beam subpaths. The x-ray transmission information can be used in creating an image representative of object 100, i.e. a representation of the x-ray transmissiveness of object 100, which can be displayed on monitor 140. The presently preferred tiered detector assembly is disclosed and described herein. Certain aspects are also disclosed and described in corresponding U.S. application Ser. No. 09/167,397, filed concurrently herewith, and which is incorporated herein by reference in its entirety.

X-ray transmissiveness information obtained from the detector elements 61 pertinent to specific image pixels are reconstructed by image reconstruction system 65. In one embodiment, image reconstruction system 65 also performs control functions and display preparation for the x-ray imaging system. Operational instructions and control of the x-ray source 10, detector 60 and image reconstruction system 65 are preferably made through a control workstation 150. Control workstation 150 also preferably receives operational and status information from the various components of the x-ray imaging system.

Figure 2:
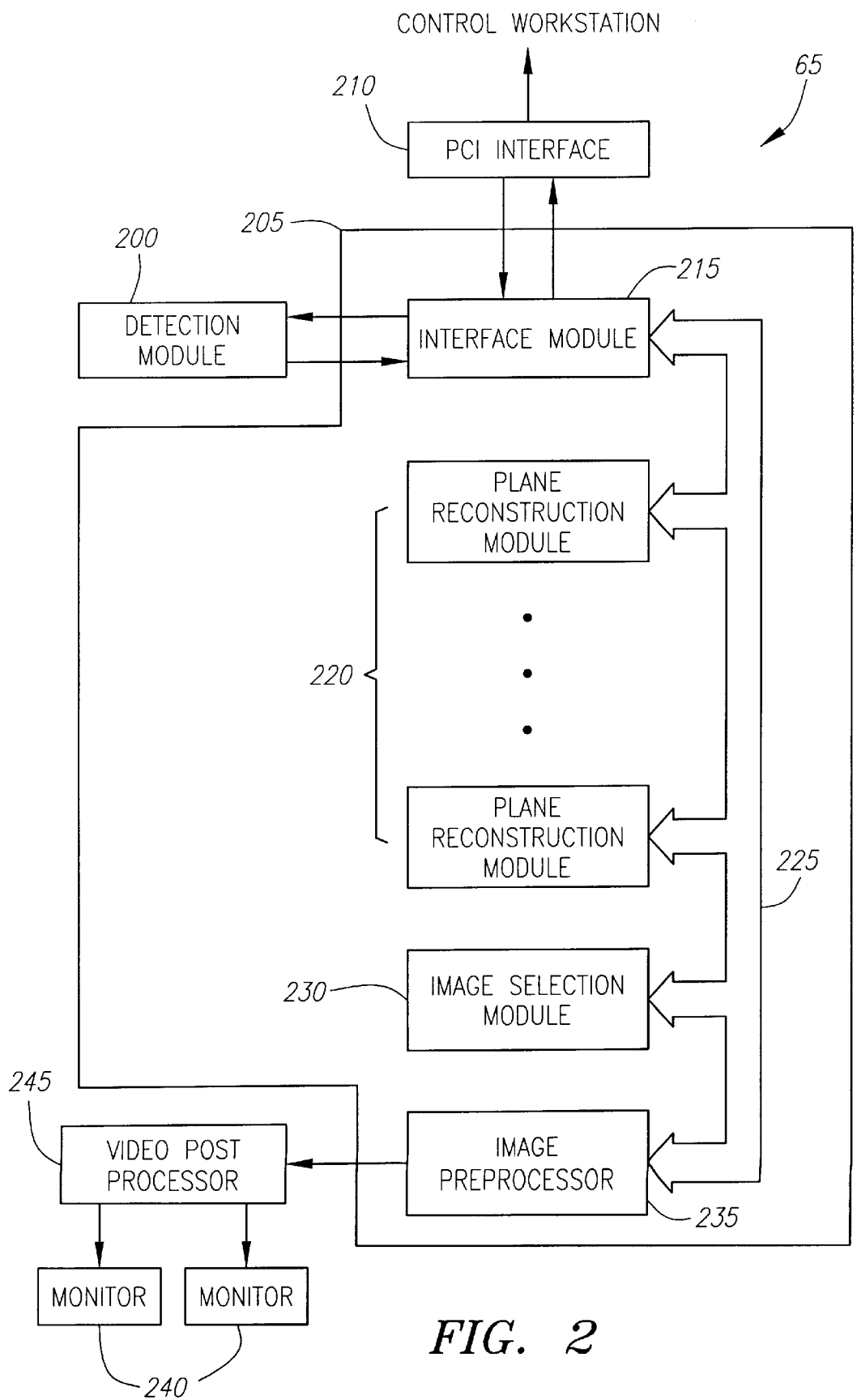
FIG. 2 is a functional block diagram of an image reconstruction system.

FIG. 2 depicts a block diagram of an embodiment of a preferred image reconstruction system 65. The image reconstruction system 65 comprises a PCI interface 210, which connects to control workstation 150. In one embodiment, a detection module 200 includes a tiered detector assembly 60 and receives x-ray transmissiveness information. Detection module 200 also comprises components to receive data signals from the tiered detector assembly. Image reconstruction chassis 205 preferably comprises an interface module 215, one or more plane reconstruction modules 220, an image selection module 230 and an image preprocessor 235. The various components on the image reconstruction chassis 205 are preferably interconnected via one or more busses 225, which also include control lines. PCI interface 210 and detection module 200 are preferably coupled to interface module 215, whereas image preprocessor 235 is coupled to video post processor 245. Video post processor 245 is coupled to display monitors 240. Details of the components depicted with reference to FIG. 2 are described in more detail in copending U.S. patent application Ser. No. 09167,171, filed on even date herewith, which is incorporated herein by reference in its entirety. Furthermore, a presently preferred detection processing system is disclosed and described in U.S. patent application Ser. No. 09/167,397, filed on the same day herewith, which is incorporated herein by reference in its entirety.

For certain applications it may be desirable or necessary to increase the x-ray flux for each area of object 100 than can be obtained from a single x-ray emission from a single aperture in the collimator. This may occur, for example, if the target assembly material is unable to withstand sufficient electron beam bombardment at one emission (e.g., because of heat generated by the bombardment) necessary to generate the desired amount of x-ray flux. In these applications, multiple smaller x-ray emissions from a single aperture can be performed. The additional x-ray flux may, in certain applications, help generate a better image by, for example, decreasing quantum noise. The preferred methods and patterns of moving electron beam 40 across target assembly 50 is described more fully in copending U.S. patent application Ser. No. 09/167,405 filed on the same day herewith, which is incorporated herein by reference in its entirety.

In a preferred embodiment, a x-ray beam 130 illuminates a collimator aperture 120 for approximately 1.04 $\mu$S measurement period. A dead time of 0.24 $\mu$S occurs as the scanning beam x-ray source 10 moves the x-ray beam to the next collimator aperture. The collimator apertures 80 are scanned row-by-row, but in a pattern that repeats each row 2, 4, or 8 times, depending on the number of collimator apertures 80. A frame is scanned every 33.33 mS.

Figure 3A:
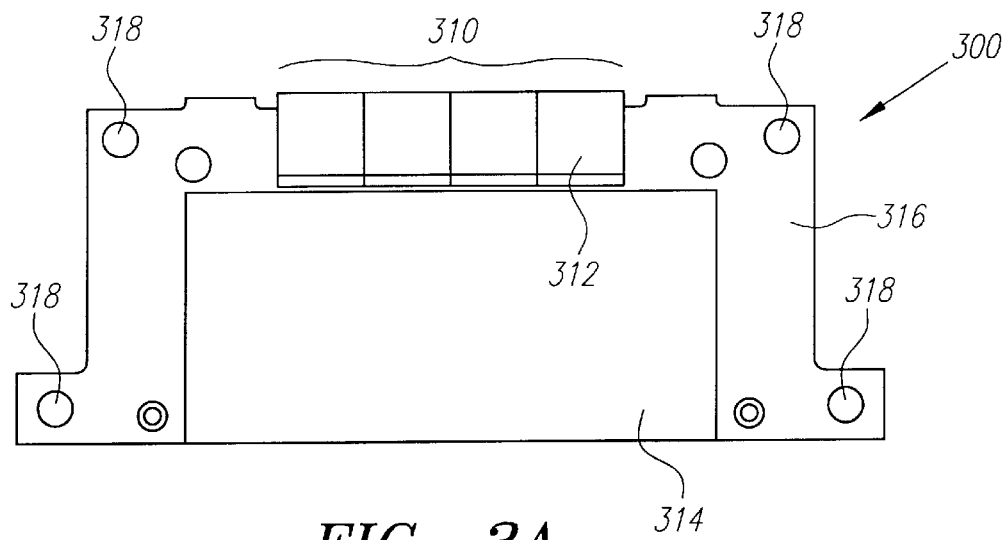
FIGS. 3A–C are top, front and side elevation views of a detector array board.
Figure 4A:
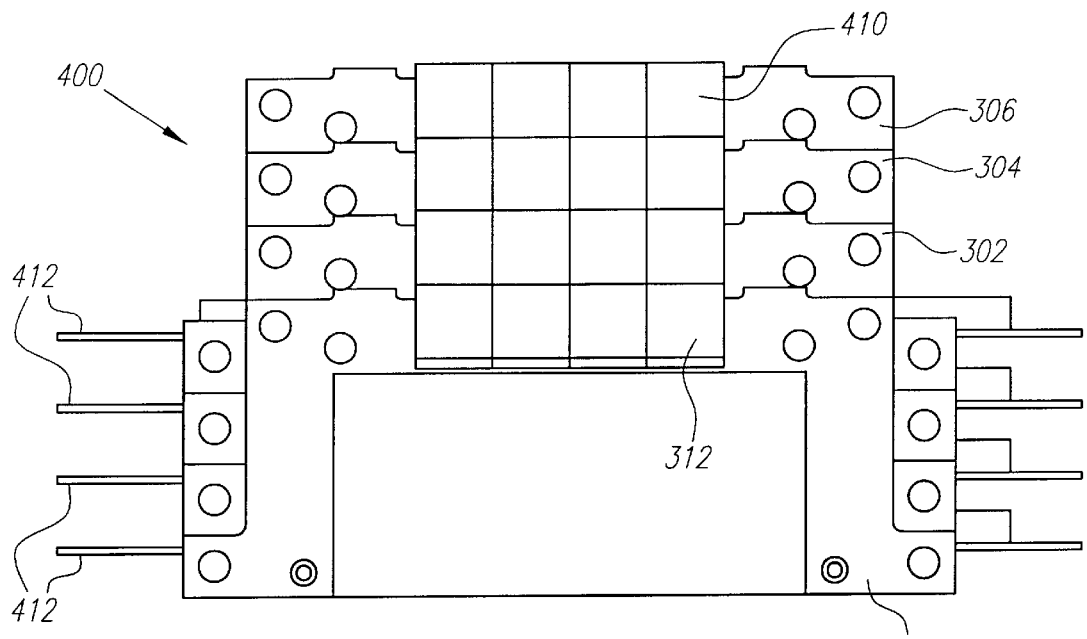
FIGS. 4A–C are top, front and side elevation views of a tiered multi-detector assembly.

The x-rays 135 passing through the object to be imaged 100 are detected at tiered assembly 60, which preferably comprises a four-by-four arrangement of detector as best seen in FIG. 4A. FIG. 3A depicts a top view of a detector array board 300. Each detector array 310 preferably comprises four detectors 312. Processing and filtering electronics for the detectors are preferably contained on printed circuit board 314. The printed circuit board 314 and detector 310 are supported by a chassis 316. The chassis 316 comprises a plurality of mounting holes 318.

Figure 3B:
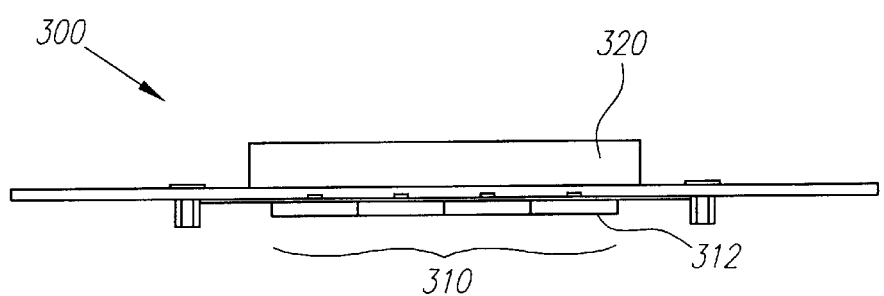
Figure 3C:
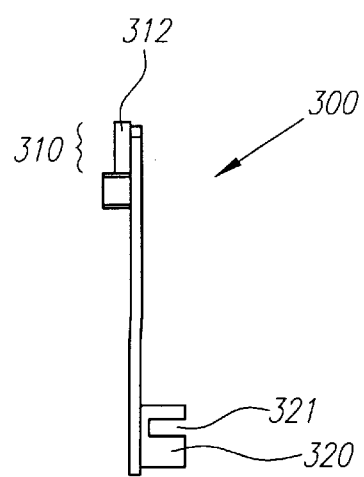

FIG. 3B is a front elevation view of detector array board 300. Card connector 320 extends the length of the detector array board 300, and is used to connect consecutive detector array boards and electronic cards. FIG. 3C shows a side elevation view of the detector array board 300.

FIG. 4A is a top view of four detector array boards 300, 302, 304 and 306 stacked in a terraced fashion, together which comprise a multi-tiered detector array 400. For purposes of explanation, although all of the detectors on each of the detector array boards are the same, reference numbers have been given to the detectors on detector array board 300 and 306 as detector 312 and 410 depict. Detector 410 is preferably no different from detector 312, except that it detects x-rays at a different location in the multi-detector array 400.

Figure 4B:
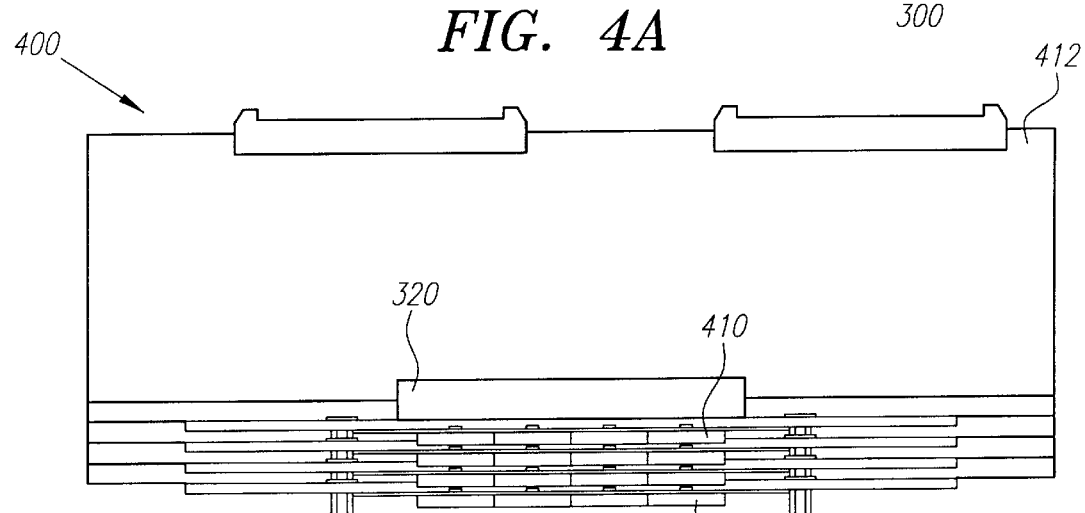
Figure 4C:
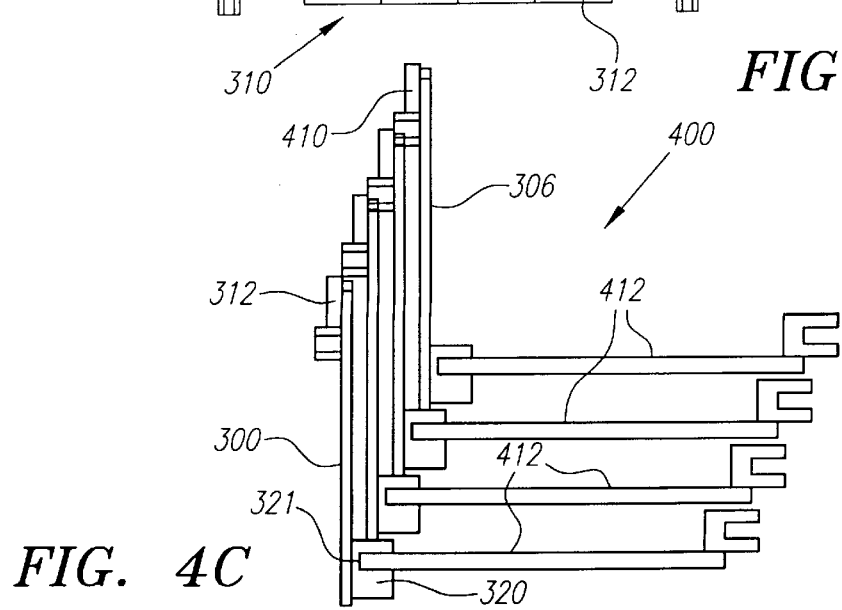

FIG. 4B is a front elevation view of the multi-tiered detector array 400. Visible in FIG. 4B are side profiles of each of the four rows of detectors. Electronics card 412 is shown inserted into slot 321 of card connector 320. Electronics card 412 includes circuitry for filtering and processing transmissivity data detected at the detector arrays. There is one electronics card 412 for each detector array board 300, 302, 304 and 306. FIG. 4C depicts a side view of the same.

Figure 5:
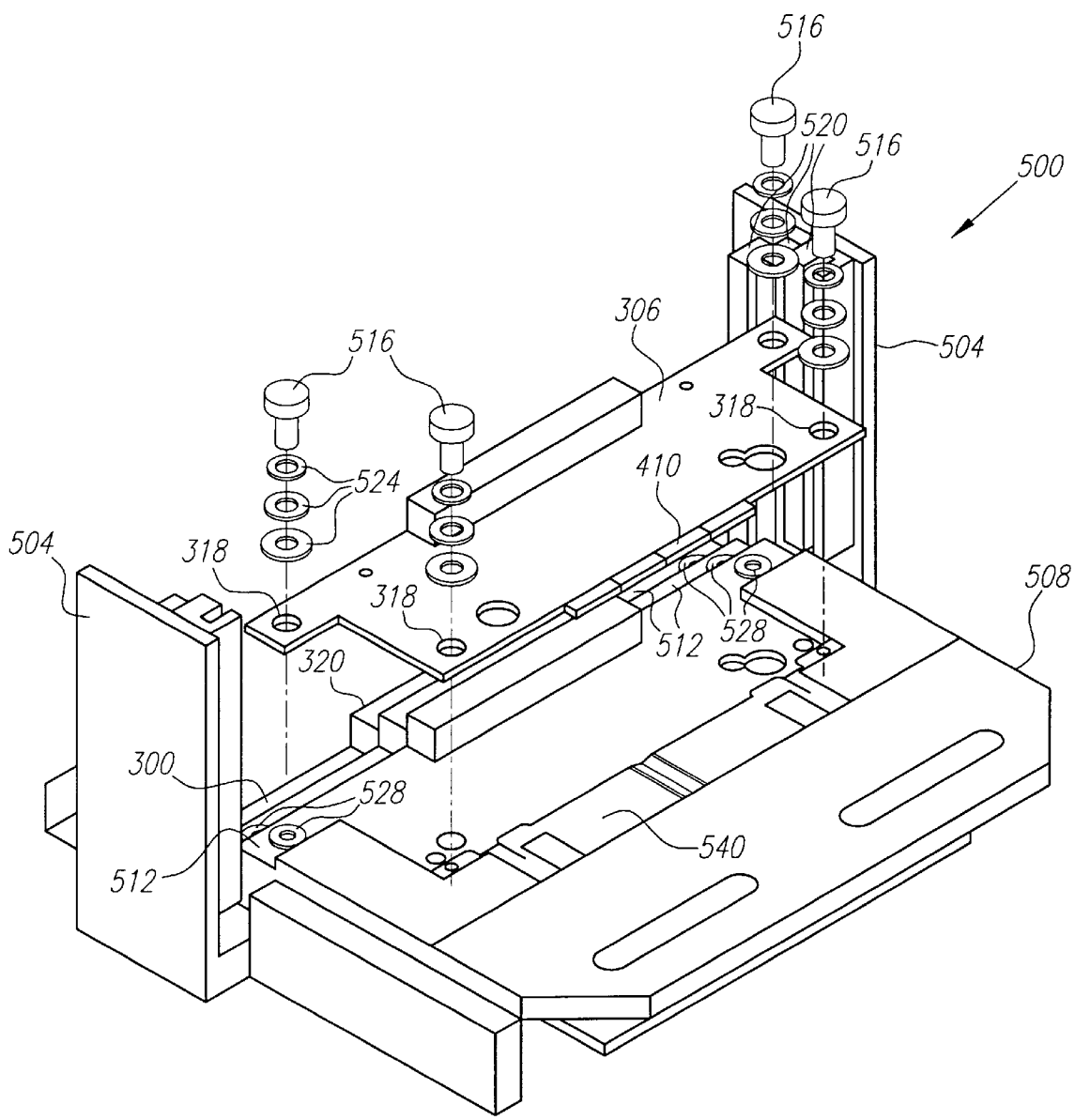
FIG. 5 is a bottom view of the tiered multi-detector assembly of FIGS. 4A–C.

FIG. 5 is a bottom view of a presently most preferred tiered multi-detector and electronics assembly 500. Walls 504 have a plurality of card guides 520, which receive and align electronics cards 412, shown in FIG. 4C. Mounting surface 508 comprises a support structure having four steps 512, which each support a detector array board, for example detector array boards 300 and 306. Each step 512 is staggered, or tiered, a distance that allows the stacking of the detector array boards while leaving a small clearance between the detector array boards; preferably the distance is 0.170 inches. A screw 516 and washer assembly 524 securely attach the detector array boards to the mounting surface 508 at screw holes 528. Just visible at the front edge of detector array board 306 is detector 410, which gives a frame of reference back to the figures described above.

The multi-detector assembly 500 is located in the x-ray imaging system so that it receives x-ray transmissivity information concerning an imaged object, as a result of x-rays emitted from the x-ray source (e.g., x-ray source 10). The sixteen detectors (for example, shown in FIG. 4A) face the x-ray source from detector opening 540.

Figure 6A:
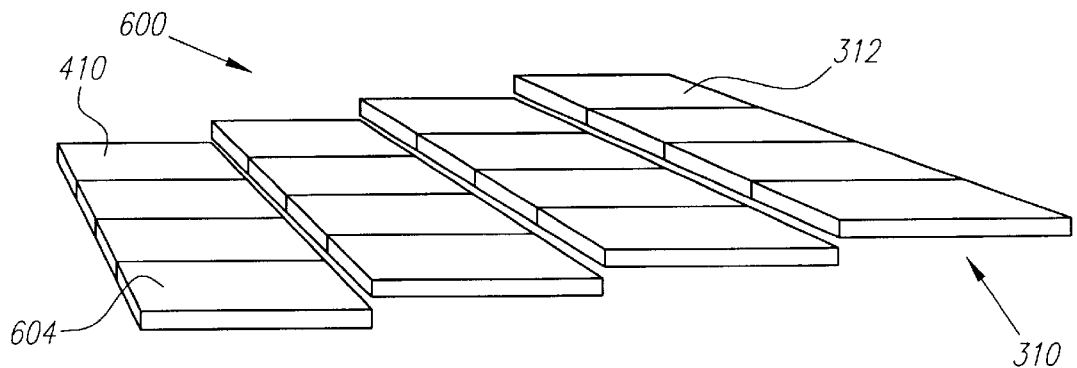
FIG. 6A is a perspective view of a tiered multi-detector assembly.
Figure 6B:
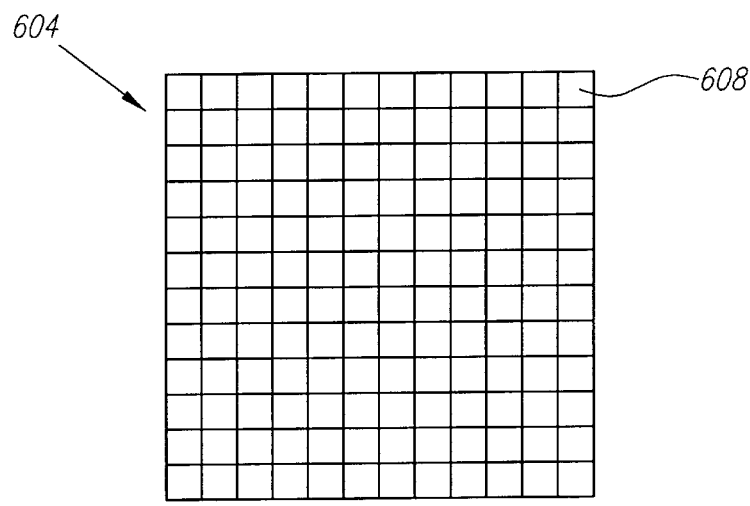
FIG. 6B is a representation of a detector.
Figure 6C:
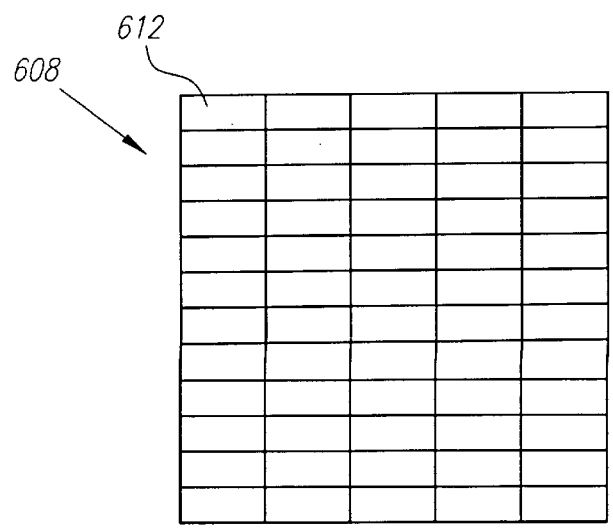
FIG. 6C is a representation of a detector element.

FIGS. 6A–C depict a varying levels of detail of the multi-detector array according to a preferred embodiment of the present invention. The presently preferred shape and area of the detector elements is such that it is statistically likely that the detection surface of any detector element 61 in the preferred multi-detector array 60 will receive at most seven x-ray photons per x-ray path. The statistical calculations are based upon the Poisson distribution and the area of the detector elements.

FIG. 6A depicts a perspective view of a tiered-array 600 of detectors, showing the preferred terracing of the one by four arrays of detectors. The tiered-array 600 of detectors is approximately 54.72 mm square (thus, an area of approximately 2994 mm$^2$).

Figure 7:
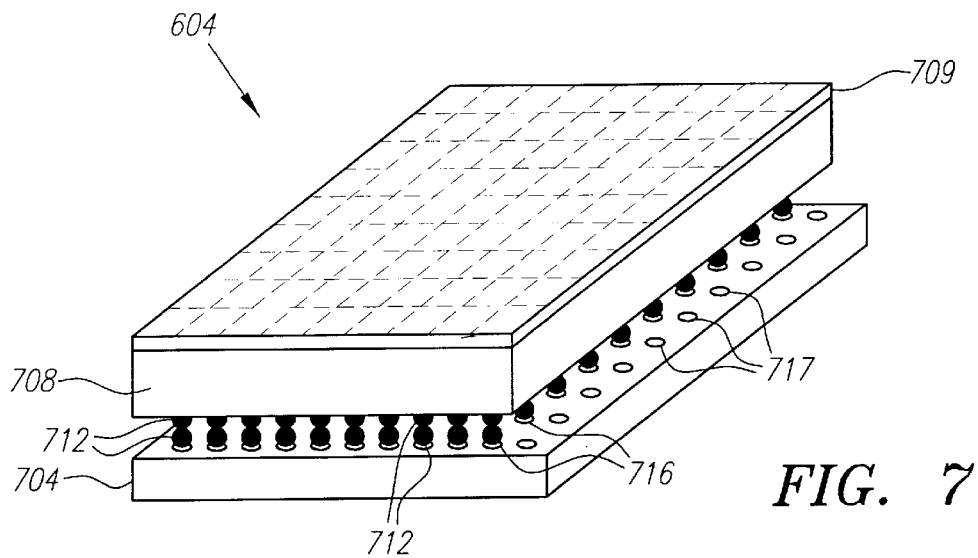
FIG. 7 is a perspective representation of a detector.

FIG. 7 depicts the presently preferred detector 604. It should be noted that FIG. 7 is not to scale, nor are the dimensions the preferred dimensions of the detector 604. Detector 604 is preferably a solid state detector comprised of a single substrate and preferably a single piece of silicon and a single piece of x-ray sensitive material, preferably an x-ray sensitive crystal and more preferably a crystal comprising Cadmium Zinc Telluride. The electrical interconnection between the silicon substrate 704 and the x-ray sensitive crystal 708 is preferably formed by a process known as bump bonding. A plurality of electrodes or "bond pads" 716 preferably of a metal material and more preferably of a platinum or gold, are formed on one surface of the silicon substrate. Similarly, a plurality of bond pads, again preferably formed of a metal material and more preferably formed from either gold or platinum, are added to one surface of the CdZTe crystal 708. Indium bumps 712 are preferably deposited on the bond pads 716 of both the silicon substrate 704 and the CdZTe crystal 708. As is known in the art, when the silicon substrate 704 and the CdZTe crystal are pressed together under the right conditions, the indium bumps 712 form an electrical connection between the bond pads on the silicon substrate 704 and the CdZTe crystal 708. Preferably a thin layer of platinum or gold 709 is deposited on the active surface, i.e., the surface that receives the x-ray photons, of the x-ray sensitive crystal.

The bond pads 716 on both the silicon substrate 704 and the CdZTe crystal 708 are preferably arranged in a 60×144 array. Because of the characteristics of the x-ray sensitive crystal 708 this effectively creates an array of 60×144 detector sub-elements. As is shown in FIG. 6B and 6C, in the most preferred embodiment these detector subelements 612 are preferably grouped into detector elements 608. Preferably there are 60 detector sub-elements 612 that comprise each detector element 608. As will be explained below this grouping into detector elements is accomplished through the summing circuitry. As seen in FIG. 6B and 6C the array of detector sub-elements forming a detector is preferably a 5×12 array. As seen in FIG. 6B, preferably the array of detector elements is a 12×12 array. It should be noted that the number and shape of the arrays may vary and may take any geometric shape for a particular application. It has been found that this is the best configuration for medical applications and the design of the most preferred image reconstruction system for use with the tiered detector assembly as described in U.S. patent application Ser. No. 09/167,171, previously incorporated herein by reference.

Each detector element 608 is approximately 1.125 mm square (thus, an area of approximately 1.266 mm$^2$). Due to the characteristics of the CdZTe crystal material and the arrangement of the bond pads 716, each detector sub-element 612 is effectively a rectangle of approximately 93 μm by 228 μm. Since there are preferably 60 detector sub-elements 612 in each detector element 608, and there are preferably 144 elements 608 in a detector 604, there are (5×12×12×12) 8640 detector sub-elements 612 in a single detector 604 and 138,240 sub-elements 612 in a preferred tiered detector assembly 60. According to a presently most preferred embodiment, however, a top row of detector sub-elements 612 on the top row of detector elements 608 in each array of detectors (e.g. detector array 310) on each detector array board 306, and the bottom row of sub-elements 612 on the bottom row of elements 608 in each array of detectors on each detector array board 306, are not utilized for detecting x-ray photons to accommodate the tiered array 600 of detectors.

The CdZTe crystal 708 is presently preferred to convert the x-ray photons to an electrical signal. However, other materials, such as Selenium (Se) or Cadmium Telluride (CdTe) can also be used, since they too are capable of sensing the x-ray photons and converting the photons into an electrical signal.

Figure 8:
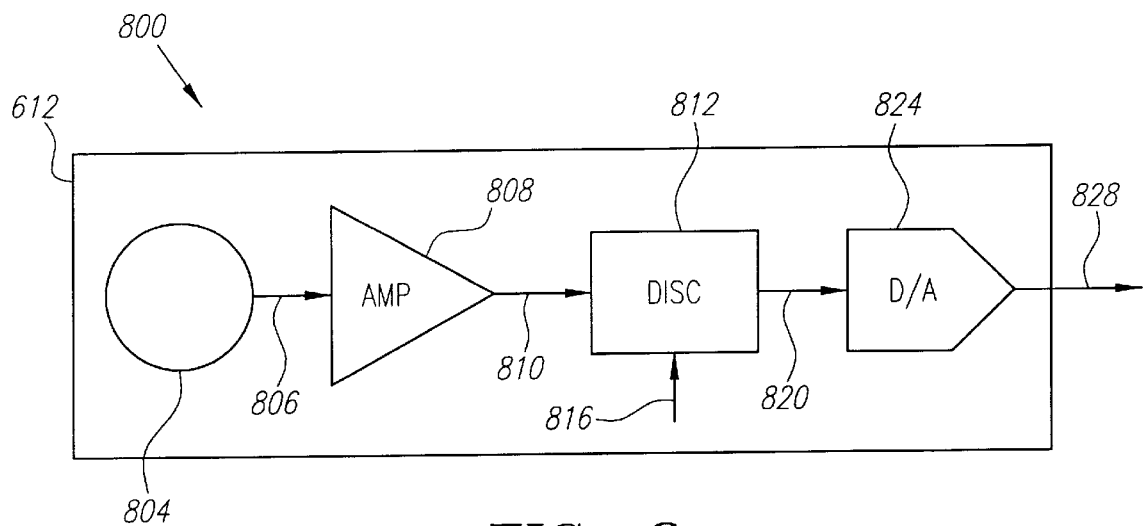
FIG. 8 is a block diagram of detector sub-element electronics.

FIG. 8 depicts a block diagram of circuitry comprising the detector sub-element electronics 800. The detector sub-element electronics 800 comprises an x-ray photon sensor 804, an amplifier 808, a discriminator 812, and a digital-to-analog (D/A) converter 824. In the preferred embodiment, the x-ray photon sensor is the portion of the CdZTe crystal defined by a bond pad 716. According to a preferred embodiment, the digital-to-analog converter further comprises a veto circuit.

As x-ray photons strike the sensor 804, electron hole pairs are created, that is, it breaks electrons away from atoms leaving behind holes. The number of electron hole pairs generated is a product of the energy of the x-ray photons. The higher the photon energy, the more electron hole pairs will be generated. The sensor 804, which comprises a crystal, has a voltage across it and hence an electron field across it. Motion of the electrons and the holes induces a charge on conducting line 806. This charge is amplified by the resetable amplifier 808. In the preferred embodiment the conducting line 806 comprises the bond pad 716 on the CdZTe crystal 708, the indium bump bond 712, the bond pad 716 on the silicon substrate 704 and the electrical trace on the silicon substrate 704. An amplified signal is output from amplifier 808 via conducting line 810 and is fed into a discriminator 812. The discriminator 812 compares the amplified signal from conducting line 810 to a threshold value 816. According to one embodiment, 10 to 120 keV photons are measured. Accordingly, x-ray photons with less than 10 keV are removed. To accomplish this end, the threshold value 816 is equivalent to 10 to 15 keV, so an equivalent amount of electrons are set as the threshold value. Here, the threshold value 816 is between 2000 and 3000 electrons. Preferably, the threshold value 816 is adjustable. If the measured energy level exceeds the threshold value, then a TRUE signal is output to conducting line 820. If the threshold value is not exceeded, then a FALSE signal is output to conducting line 820.

Digital-to-analog converter 824 is fed with the output of the discriminator 812 via conducting line 820. The digital-to-analog converter 824 is preferably a digital-to-current converter. According to a preferred embodiment, the digital-to-analog 824 converter includes a veto circuit and a fixed output current source. The veto circuit accepts or rejects the input from the discriminator 812 based upon external values, or feedback from other discriminators 812. The veto circuit accepts as inputs a KILL signal, an input from a detector sub-element above it, and an input from a detector sub-element to the left of it. If any of these signals are TRUE, then the veto circuit rejects the TRUE signal from a discriminator 812. (Note that a FALSE signal does not need to be rejected.)

The veto circuit minimizes the possibility of double counting of an x-ray photon. It is possible that x-ray photons incident on a particular detector sub-element will generate an electrical signal above the threshold value of nearest neighbor or next to nearest neighbor detector sub-elements of the particular detector sub-element. As for the KILL signal, it is based upon external control and the result of a test of the detector sub-elements. If a particular detector sub-element is known to leak current or give erroneous readings, that is, give a TRUE signal even though x-ray photons are not striking the sub-element, then readings from that particular sub-element should be ignored, hence, a KILL signal to turn off the particular detector sub-element. Of course, in the broader spirit of the invention, different logic can be employed in the veto circuit if, for example, different x-ray flux levels are utilized.

Preferably the detector sub-element electronics 800 are formed in the silicon substrate 704 in an area surrounding the bonding pad 716 and more preferably under the bonding pad 716.

Figure 9:
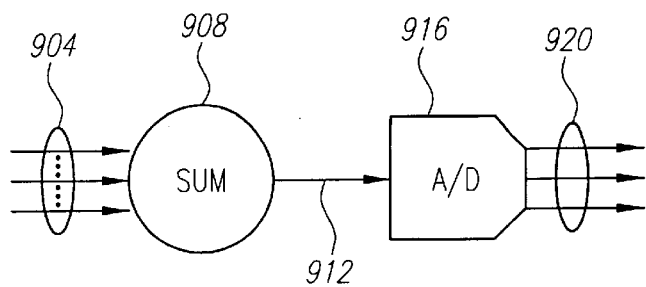
FIG. 9 is a block diagram of summing circuitry.

FIG. 9 depicts a block diagram of a current summing bus and an analog-to-digital converter. Output 904 from the 60 (or less, depending on the location) detector sub-elements (e.g., output 828 of sub-element 612) are combined at summing junctions 908, which result in a summing current bus 912. The summing current bus 912 is essentially an analog counter, the current carried by the summing current bus 912 being representative of the number of sub-elements that sensed x-ray photons (and passed the discriminator and veto circuit tests). The current summing bus 912 feeds a current-to digital converter 916. The current-to-digital converter 916 transforms the analog current into a three-bit digital value representing transmissiveness values 0 through 7. The three-bit digital value is output on a three-bit digital bus 920. In the preferred embodiment, each detector has 48 by 12 three-bit data words associated with it, which yields 48×48 three-bit data words for the entire preferred tiered detector and electronics assembly 600 (FIG. 6).

Preferably the summing circuitry is located in an area on the silicon substrate 704 in close proximity to the array of detector sub-elements that comprise the detector elements.

The photons detected by the detector sub-elements 612 are preferably summed and sampled during the inter-collimator hole period and are subsequently converted to digital values by on-chip current-to-digital converters (e.g., analog-to-digital converter 916) during the next measurement period. The 144 sampled and digitized values are read out during the following measurement cycle, that is the cycle for the next detector (e.g., detector 312).

The silicon substrate 704 is preferably slightly larger in one dimension than the CdZTe crystal 708. Contact pads 717 are preferably formed in this area for connection with the electronics on the detector array board 306.

According to one embodiment, and as described in above, a measurement is made approximately every 1 µS. In this time frame, it is preferred that the detector element 608 is capable of counting 7 photons. This yields a sample rate on the order of 7×10⁶ photons per second.

FIGS. 10–15 are electrical schematics, employing standard electrical symbology, of various electronics described above with reference to FIGS. 8 and 9.

Figure 10:
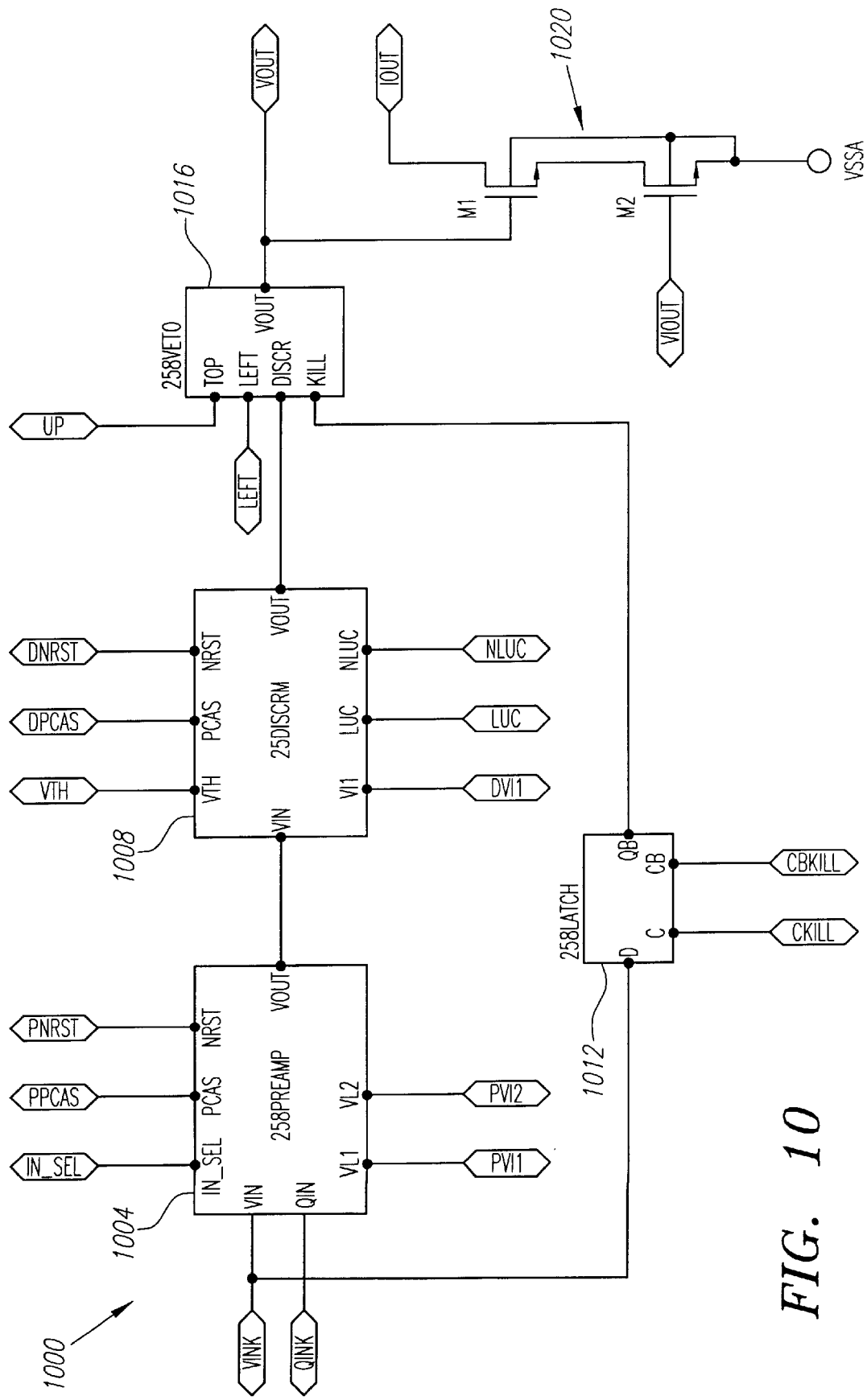
FIG. 10 is an electrical schematic of detector sub-element electronics.
Figure 11:
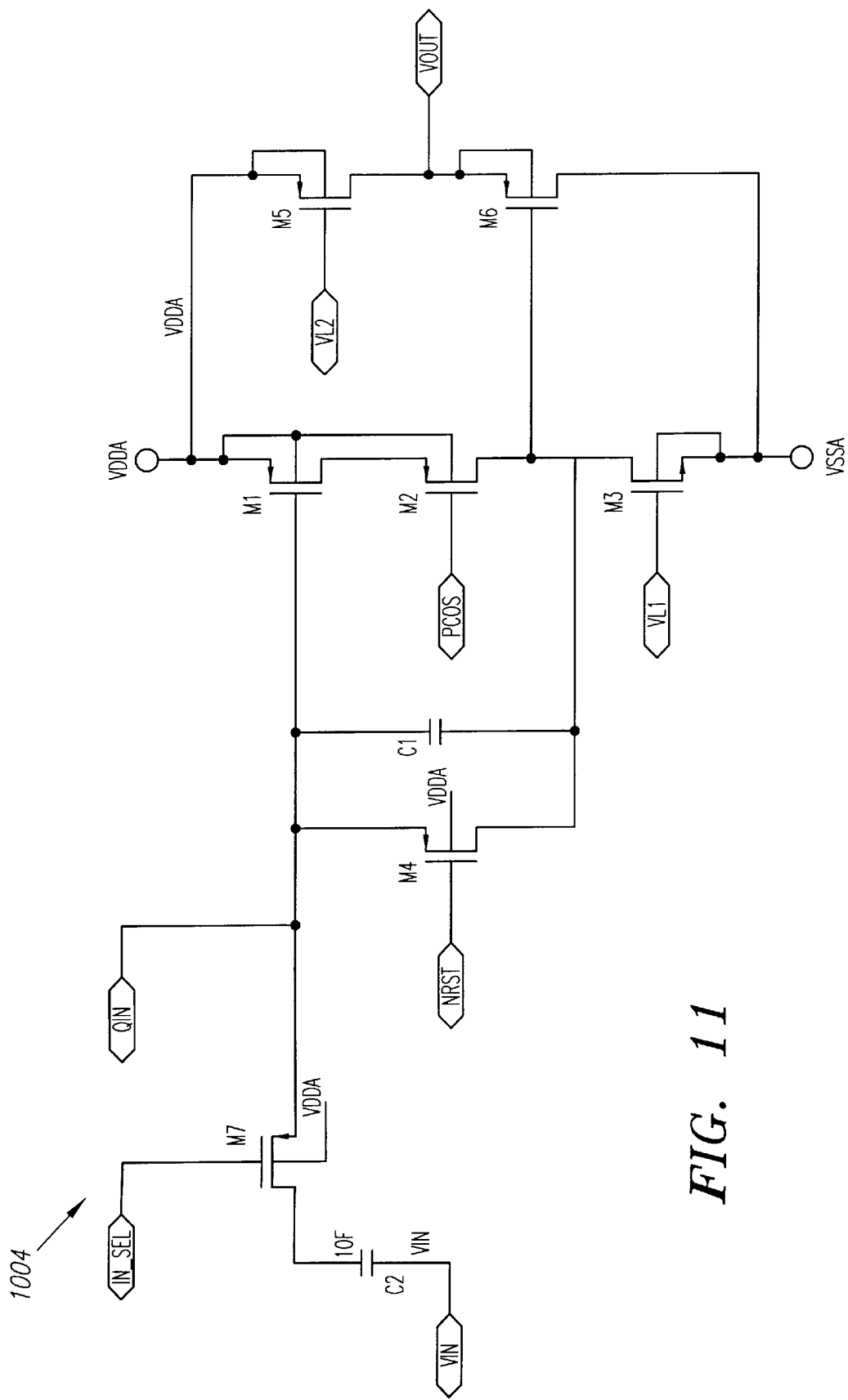
FIG. 11 is an electrical schematic of a preamplifier.
Figure 12:
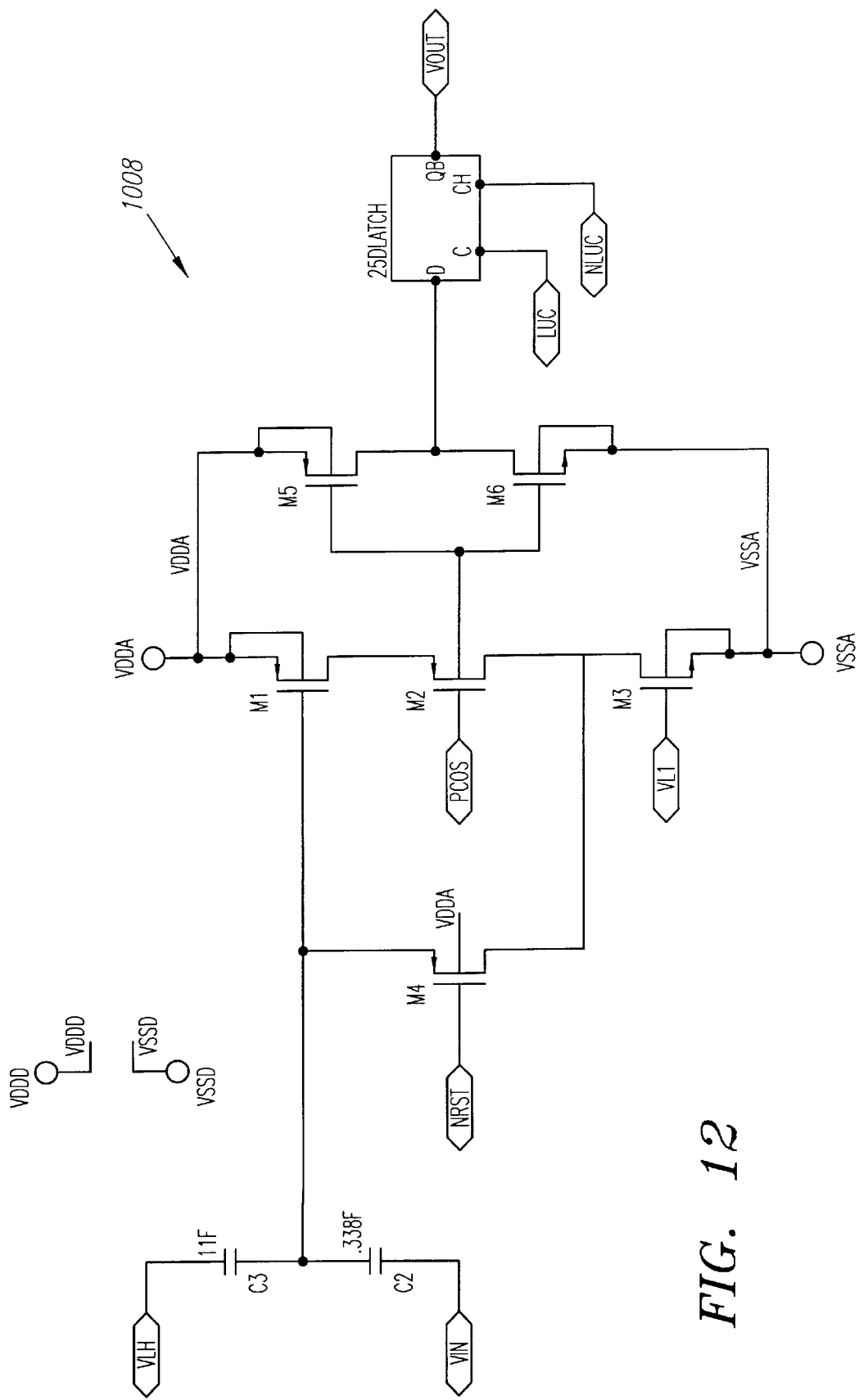
FIG. 12 is an electrical schematic of a discriminator.
Figure 13:
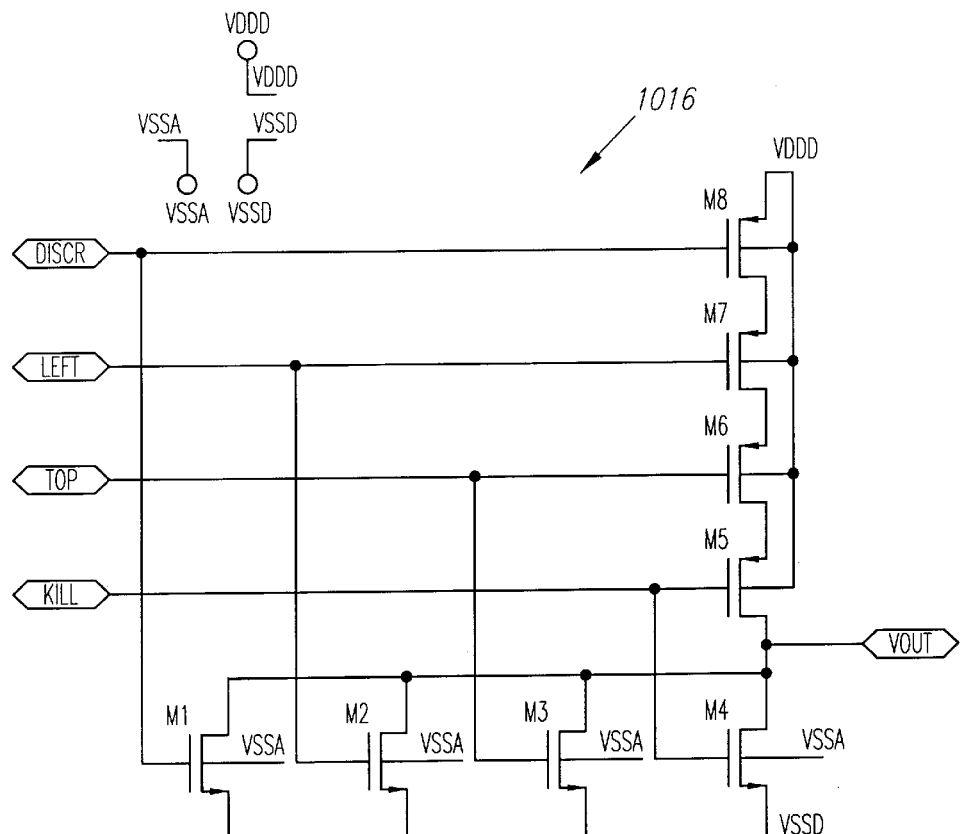
FIG. 13 is an electrical schematic of veto circuitry.
Figure 14:
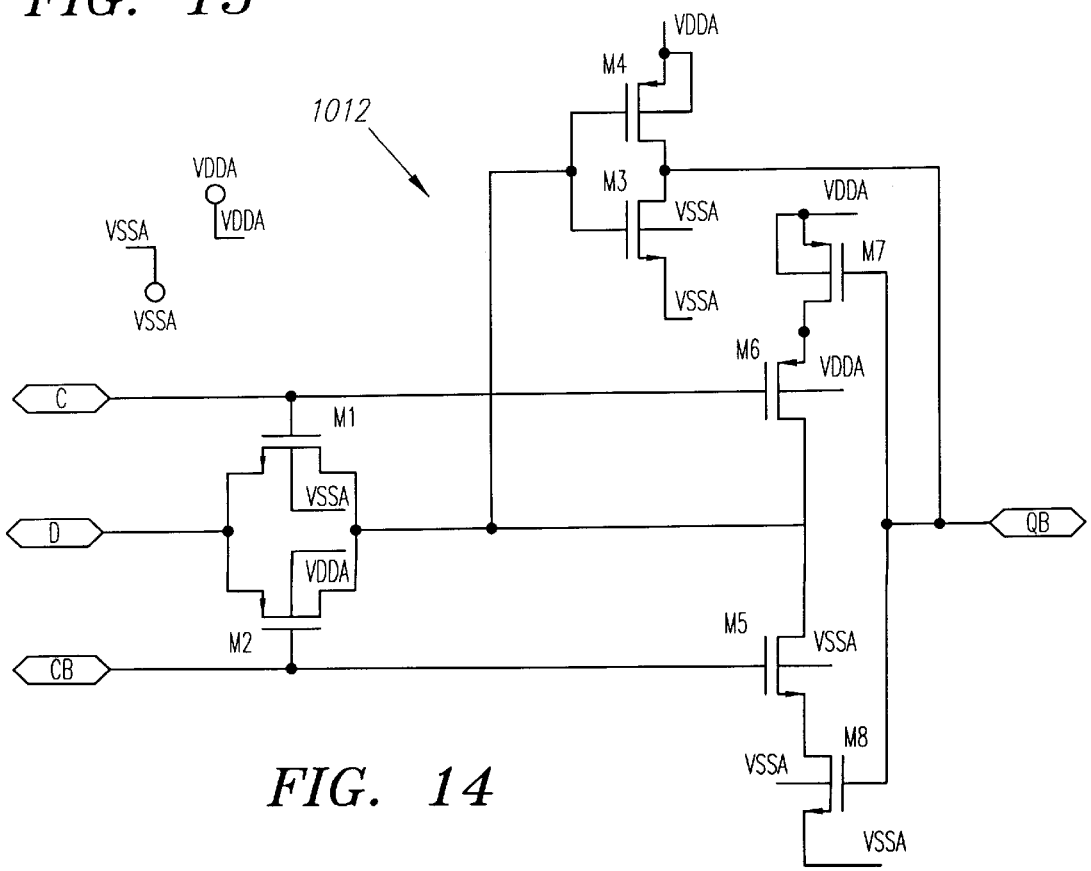
FIG. 14 is an electrical schematic of latch electronics.

FIG. 10 is an electrical schematic of presently most preferred detector sub-element electronics 1000. The detector sub-element electronics 1000 receives an input from a photon sensor (not shown) at amplifier 1004. Amplifier 1004 in turn feeds a signal to discriminator 1008. Discriminator 1008 feeds an output to veto circuit 1016. A latch 1012 connects an input voltage to the veto circuit 1216, based upon an external signal (e.g., from a control workstation 150). The veto circuit 1016 turns on or off a constant current source 1020. FIG. 11 depicts electronics for the amplifier 1004, FIG. 12 depicts electronics for the discriminator 1008, FIG. 13 depicts electronics for veto circuit 1016, and FIG. 14 depicts an electronics for the latch 1012.

Figure 15:
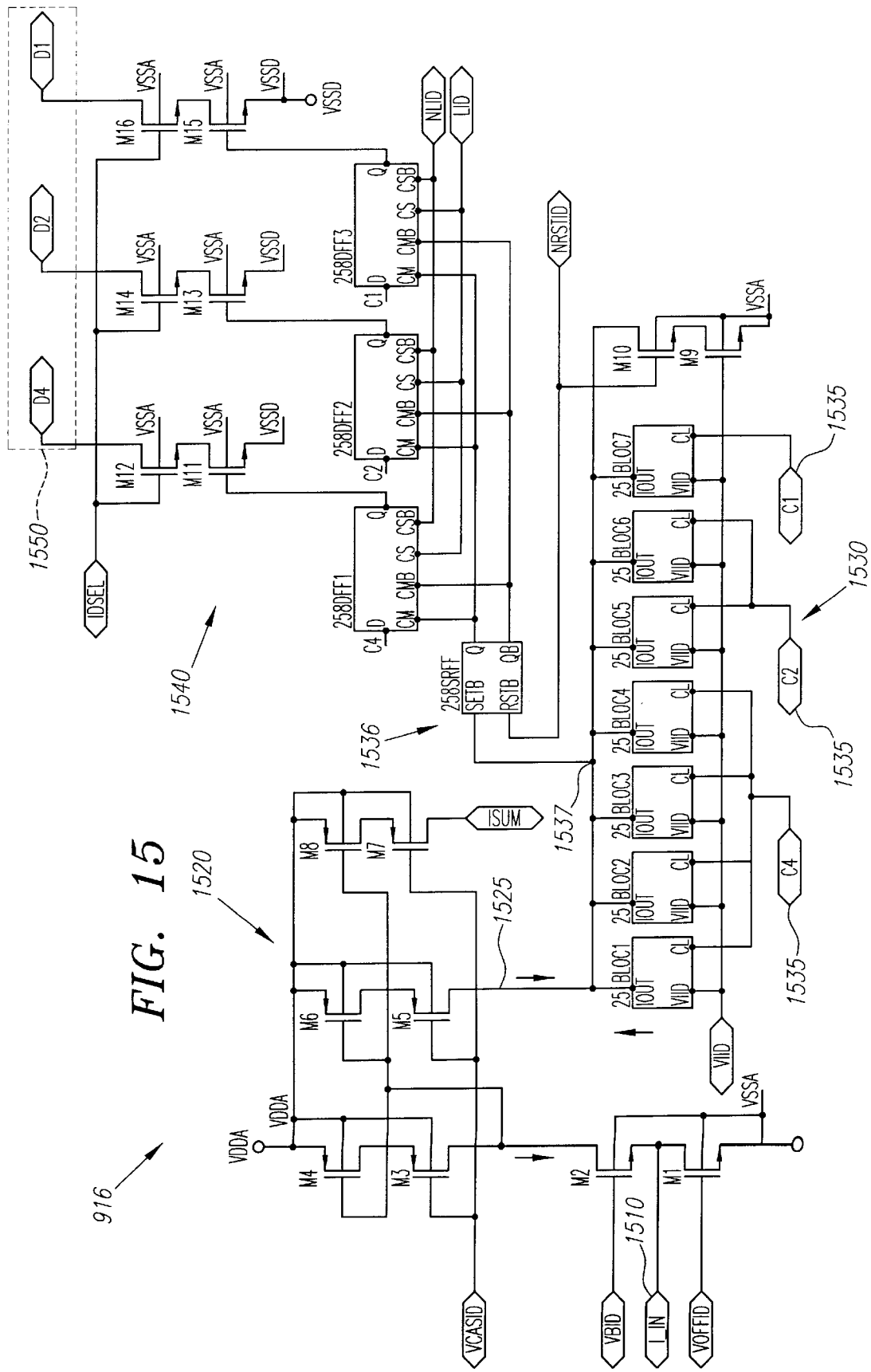
FIG. 15 is an electrical schematic of a current-to-digital converter.

FIG. 15 depicts an electrical schematic for the analog-to-digital converter 916 depicted in FIG. 9 which, according to a preferred embodiment, is a current-to-digital converter. The current from the summing bus 912 is input at terminal 1510. A current mirror 1520 replicates the current on line 1525. A counting current source 1530 generates a current corresponding to values 0–7, via counting selectors 1535. The sum of the two currents creates a voltage potential that increases to a particular point at terminal 1537. A comparator 1536 monitors the voltage at terminal 1537. When the voltage at terminal 1537 passes a threshold value, the value at counting selectors 1535 is latched into digital bit drivers 1540 by the comparator 1536. The result is a three-bit digital value representing discrete x-ray transmissivity information. This value is output on three-bit digital bus 1550.

In the foregoing specification, the invention has been described with reference to specific embodiments thereof. It will be evident, however, that various modifications and changes may be made thereto without departing from the broader spirit and scope of the invention. The specification and drawings are, accordingly, to be regarded in an illustrative, rather than a restrictive sense.

What is claimed is:

1. A detector comprising:
   at least one detector element, each detector element comprising:
   a plurality of detector sub-elements, having outputs indicative of the detection of a photon; said outputs of said plurality of sub-elements electrically coupled to summing circuitry; said summing circuitry and said detector sub-elements mounted on a single substrate.

2. The detector of claim 1, further comprising an array of detectors; said detectors each comprising an array of said detector elements; said detectors each formed on a separate silicon substrate.

3. The detector of claim 2, said array of detectors are arranged in a tiered array.

4. The detector of claim 2, said array of detectors arranged in a four x four array with each row of four detectors lies in a different plane.

5. A detector comprising:
   a single silicon substrate;
   a plurality of detector sub-elements, said plurality of detector sub-elements mounted to said single piece of silicon;
   a plurality of detector elements, each of said plurality of detector elements formed from a plurality of detector sub-elements; said plurality of detector sub-elements comprising:
   a photon sensor;
   an amplifier, said amplifier electrically coupled to said photon sensor;
   a discriminator, said discriminator electrically coupled to said amplifier, said discriminator configured to reject certain signals from said amplifier; and
   a digital-to-analog converter; said digital-to-analog converter electrically coupled to said discriminator, said digital-to-analog converter configured to convert a signal from said discriminator into a constant value current source.

6. The detector of claim 5, further comprising:
   summing circuitry, said summing circuitry configured to receive a current from each of said plurality of detector sub-elements forming said detector element; and
   a current summing bus, said current summing bus configured to a carry x-ray transmissiveness information representing said plurality of detector sub-elements.

7. The detector of claim 5, further comprising veto circuitry, said veto circuitry electrically connected to said discriminator and said digital-to-analog converter, said veto circuitry configured to reject a signal from said discriminator.

8. A method for generating x-ray transmissiveness information for a detector sub-element comprising the acts of:

detecting an x-ray beam from a scanning beam x-ray source;

measuring an energy level of photons in said x-ray beam;

comparing said measured energy level to a threshold value;

in response to said step of comparing, if said measured energy level is less than said threshold value, then rejecting said measured energy level;

receiving x-ray transmissiveness information from a plurality of adjacent detector sub-elements;

testing said x-ray transmissiveness information from said plurality of adjacent detector sub-elements; and in response to said step of testing, vetoing said measured value if said x-ray transmissiveness information indicates one or more of said adjacent detector sub-elements detected x-ray photons above said threshold value.

9. The method of claim 8, further comprising:

converting said measured value from an analog value to a digital value;

summing said digital value with a plurality of additional digital values;

driving a value generated from said step of summing on a single line bus;

receiving said value from said single bus at a current-to-digital converter; and converting said received value from a current to a second digital value.

\* \* \* \* \*